United States Patent
Higaki et al.

(10) Patent No.: US 9,634,638 B2
(45) Date of Patent: Apr. 25, 2017

(54) CONTROL DEVICE, AUTOMATIC MATCHING METHOD FOR ANTENNAS, AND WIRELESS DEVICE

(71) Applicant: KABUSHIKI KAISHA TOSHIBA, Tokyo (JP)

(72) Inventors: Makoto Higaki, Tokyo (JP); Koh Hashimoto, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 84 days.

(21) Appl. No.: 14/701,551

(22) Filed: May 1, 2015

(65) Prior Publication Data

US 2015/0365065 A1 Dec. 17, 2015

(30) Foreign Application Priority Data

Jun. 17, 2014 (JP) ................. 2014-124470

(51) Int. Cl.
| | |
|---|---|
| *H01Q 1/50* | (2006.01) |
| *H03H 7/40* | (2006.01) |
| *H04B 1/04* | (2006.01) |
| *H04B 1/18* | (2006.01) |
| *H03H 7/01* | (2006.01) |

(52) U.S. Cl.
CPC ............... *H03H 7/40* (2013.01); *H01Q 1/50* (2013.01); *H04B 1/0458* (2013.01); *H04B 1/18* (2013.01); *H03H 7/0115* (2013.01)

(58) Field of Classification Search
CPC .......... H01Q 1/50; H03H 7/0115; H03H 7/40
USPC ......................... 343/850, 860, 861
See application file for complete search history.

(56) References Cited

U.S. PATENT DOCUMENTS

| | | | | |
|---|---|---|---|---|
| 6,590,538 B1 * | 7/2003 | Koyanagi | ............. | H01Q 1/241 343/702 |
| 8,174,460 B2 * | 5/2012 | Larson | ................. | H01Q 1/273 343/860 |
| 8,412,121 B2 * | 4/2013 | Bonnet | ................. | H01Q 1/241 343/700 MS |
| 8,803,758 B2 * | 8/2014 | Higaki | ................... | H01Q 9/42 343/850 |

(Continued)

FOREIGN PATENT DOCUMENTS

| | | |
|---|---|---|
| JP | 2006-324984 | 11/2006 |
| JP | 2006-340028 | 12/2006 |

(Continued)

OTHER PUBLICATIONS

Extended European Search Report dated on Nov. 19, 2015 for Application No. 15166904. 8 pages.

*Primary Examiner* — Tho G Phan
(74) *Attorney, Agent, or Firm* — Finnegan, Henderson, Farabow, Garrett & Dunner, LLP (57) ABSTRACT

A control device includes a power detector that detects a power of a signal transmitted by an antenna, a transmitting power of the signal fluctuating due to transmit power control; and a controller that adjusts a setting value of a variable matching circuit in such a way that the power increases based on a result of comparison of a reference value with a detected power of the power detector, that detects fluctuation in the transmitting power based on a temporal change in the detected power, and that corrects the reference value based on the fluctuation in the transmitting power.

12 Claims, 4 Drawing Sheets (56) References Cited

U.S. PATENT DOCUMENTS

| | | | |
|---|---|---|---|
| 2005/0184922 A1* | 8/2005 | Ida | H04B 1/0458 343/861 |
| 2006/0094458 A1 | 5/2006 | Kitaji | |
| 2012/0112851 A1 | 5/2012 | Manssen et al. | |
| 2012/0171970 A1 | 7/2012 | Muhammad | |
| 2013/0069737 A1 | 3/2013 | See et al. | |

FOREIGN PATENT DOCUMENTS

| | | |
|---|---|---|
| JP | 2013-016949 | 1/2013 |
| KR | 2013-0070448 A | 6/2013 |

\* cited by examiner

CONTROL DEVICE, AUTOMATIC MATCHING METHOD FOR ANTENNAS, AND WIRELESS DEVICE

CROSS-REFERENCE TO RELATED APPLICATION(S)

This application is based upon and claims the benefit of priority from Japanese Patent Application No. 2014-124470, filed on Jun. 17, 2014; the entire contents of which are incorporated herein by reference.

FIELD

An embodiment described herein relates generally to an control device, an automatic matching method for antennas, and a wireless device.

BACKGROUND

Typically, an antenna device is known in which a matching circuit is installed for the purpose of achieving automatic matching of the input impedance of an antenna and the output impedance of a wireless unit. The antenna device further includes a generating circuit for generating a reference signal for the purpose of matching the impedances; and matches the impedance of the antenna based on the reference signal. As a result, when wireless communication based on transmit power control is being performed, the impedance matching can be performed in a stable manner.

However, in a conventional antenna device, while the impedance of the antenna is being matched, the wireless unit is separated from the antenna; the generating circuit is connected to the antenna. For that reason, during impedance matching, it is not possible to perform wireless communication.

DETAILED DESCRIPTION

Figure 1:
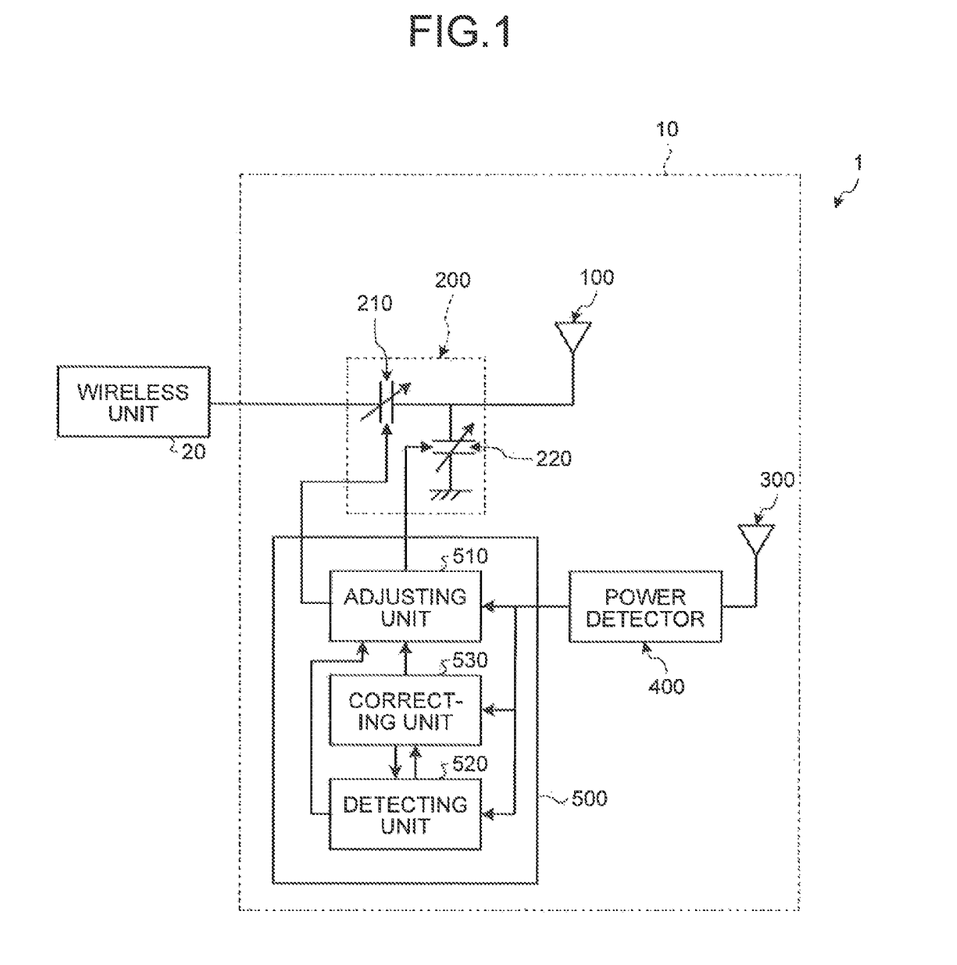
FIG. 1 is a diagram illustrating a configuration of a wireless device according to an embodiment.

Explained below with reference to FIG. 1 is a configuration of a wireless device 1 according to an embodiment. The wireless device 1 includes an antenna device and a wireless unit 20 that transmits and receives signals via the antenna device 10.

The antenna device 10 includes an antenna 100 that transmits and receives signals; a variable matching circuit 200 that matches the impedance of the antenna 100; and a probe 300 that receives the signals transmitted by the antenna 100. Moreover, the antenna device 10 includes a power detector 400 that detects the power of the signals received by the probe 300; and a controller 500 that controls the variable matching circuit 200. A device that includes the power detector 400 and controller 500 is called a control device. The control device may further include wireless unit 20.

The antenna 100 transmits signals of which the transmitting power fluctuates based on the transmit power control. These signals are generated by the wireless unit 20. The antenna 100 outputs received signals to the wireless unit 20. As long as the antenna 100 transmits and receives signals, it may be of an arbitrary shape and type. Examples of the antenna 100 include a monopole antenna, a dipole antenna, and a loop antenna.

The variable matching circuit 200 is connected at one end to a feeding point of the antenna 100 and connected at the other end to the wireless unit 20. The variable matching circuit 200 matches the impedance of the antenna 100 according to the frequency, the communication state, or the like of the signals generated by the wireless unit 20.

The variable matching circuit 200 includes a first variable element 210 and a second variable element 220. According to an instruction by the controller 500, the variable matching circuit 200 controls the first variable element 210 and the second variable element 220, and matches the input impedance of the antenna 100 and the output impedance of the wireless unit 20.

The first variable element 210 is a variable capacitance element connected at one to the feeding point of the antenna 100 and connected at the other end to the wireless unit 20. The second variable element 220 is a variable capacitance element connected at one end to the feeding point of the antenna 100 and short-circuited at the other end. The first variable element 210 and the second, variable element 220 are elements configured with, for example, a semiconductor or a microelectromechanical system (MEMS).

Herein, the explanation is given for an example in which the first variable element 210 and the second variable element 220 are variable capacitance elements. However, as long as the first variable element 210 and the second variable element 220 are capable of adjusting the impedance of the variable matching circuit 200, they may be variable inductors or switches. The variable matching circuit 200 may be configured with a combination of such different types of elements.

Moreover, the number of variable elements included in the variable matching circuit 200 is not limited to two. That is, any number of variable elements may be used as long as the impedance of the variable matching circuit 200 can be adjusted. Furthermore, in order to adjust the variable range of impedance, it is possible to further include capacitance elements having fixed capacitance values and inductor elements having fixed inductance values.

The probe 300 is arranged in the vicinity of the antenna 100, and receives signals transmitted by the antenna 100. The probe 300 has, for example, the dipole shape or the monopole shape. As long as the probe 300 is able to receive signals transmitted by the antenna 100, the probe 300 may nave any of the various other shapes.

The power detector 400 detects, via the probe 300, the power of the signals transmitted by the antenna and generates a detected value. Then, the power detector 400 outputs, to the controller 500, direct-current voltage, or direct current, or binary data as the detected value.

The controller 500 controls the variable matching circuit 200 to match the impedance of the antenna 100. The controller 500 includes an adjusting unit 510, a detecting unit 520, and a correcting unit 530.

The adjusting unit 510 adjusts the setting value of the variable matching circuit 200 based on the result of comparison between a reference value and the detected value of the power detector 400 in such a way that the power of the signals increase. Since the variable matching circuit 200 includes variable capacitance elements, namely, the first variable element 210 and the second variable element 220, the adjusting unit 510 adjusts a capacitance value C1 of the first variable element 210 and adjusts a capacitance value C2 of the second variable element 220.

The detecting unit 520 detects fluctuation in the transmitting power based on the temporal change in the detected value of the power detector 400. The detecting unit 520 detects fluctuation in the transmitting power based on a change amount of the detected value in which the detected value is changed with the time. The correcting unit 530 corrects the reference value based on the fluctuation in the transmitting power detected by the detecting unit 520.

The controller 500 is implemented using, for example, a microcomputer IC. Thus, the controller 500 either may include the adjusting unit 510, the detecting unit 520, and the correcting unit 530 as described above, or may be configured to implement the functions of those constituent elements. Regarding an adjustment processing performed by the controller 500 with respect to the variable matching circuit 200, the details are given later.

The wireless unit 20 includes a signal processing unit (not illustrated) and an amplifying unit (not illustrated), and generates signals having the controlled transmitting power. The wireless unit 20 determines the transmitting power of the signals. The wireless unit 20 amplifies and outputs the signals to the antenna device 10 in such a way that the generated signals are transmitted at the determined transmitting power. In this way, the wireless unit 20 generates signals and performs transmit power control of the generated signals at a constant period T2 (see FIG. 3). Moreover, the wireless unit 20 performs signal processing with respect to the signals received via the antenna 100.

Adjustment Processing

Figure 2:
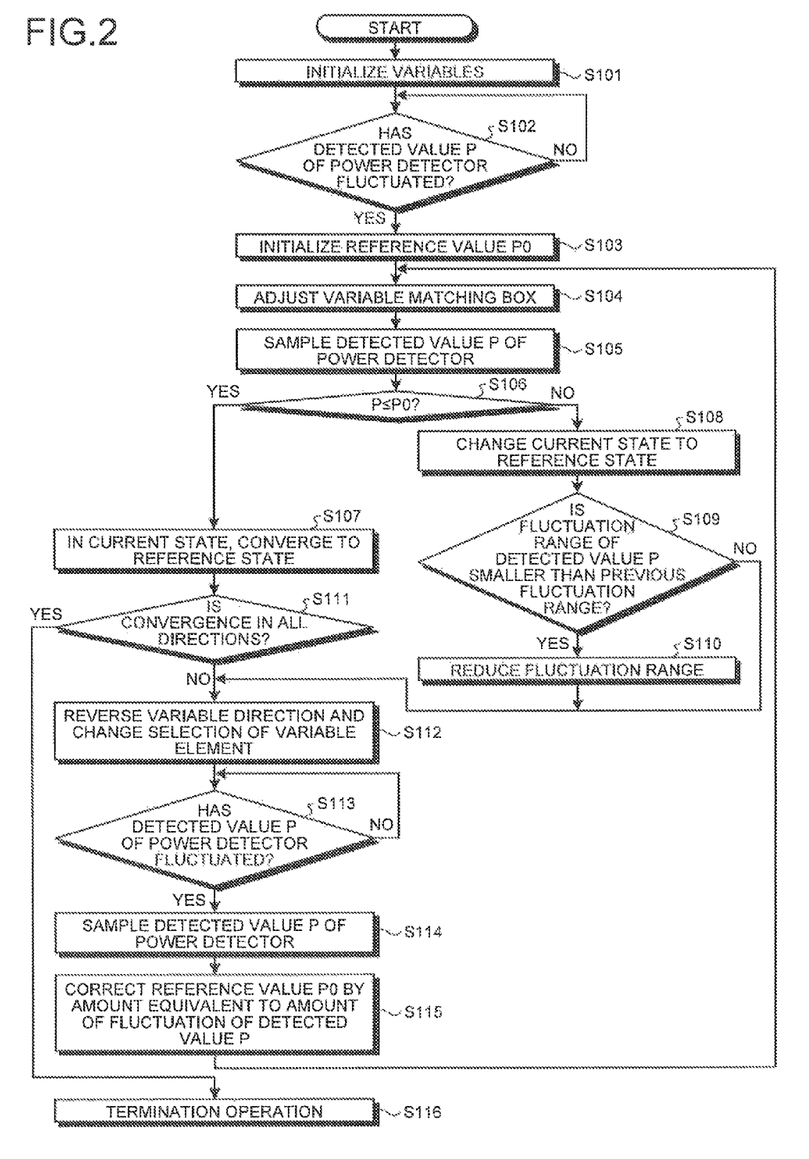
FIG. 2 is a flowchart for explaining an adjustment processing according to the embodiment.
Figure 3:
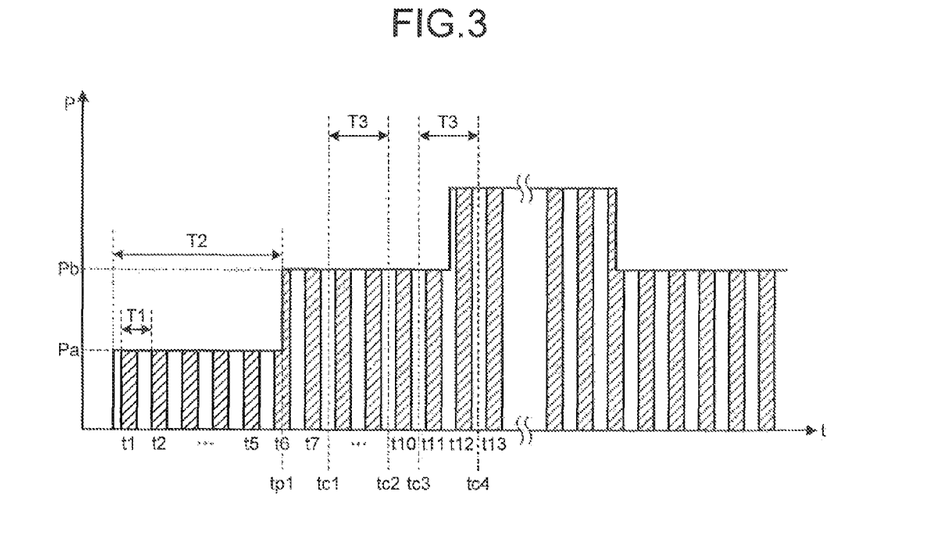
FIG. 3 is a diagram for explaining transmit power control according to the embodiment.

Explained below with reference to FIGS. 2 and 3 is an adjustment processing performed by the controller 500 to control the variable matching circuit 200. FIG. 2 is a flowchart for explaining the adjustment processing performed with respect to the variable matching circuit 200. FIG. 3 is a diagram illustrating an example of transmit power control performed by the wireless unit 20. In FIG. 3, the horizontal axis represents the time, and the vertical axis represents a transmitting power P of the signals determined by the wireless unit 20.

The controller 500 starts the control of the variable matching circuit 200 in response to, for example, an instruction from the wireless unit 20 or a higher layer (not illustrated) about the need to perform the adjustment processing with respect to the variable matching circuit 200. For example, when wireless communication starts or when there is deterioration in the communication quality during communication, the wireless unit 20 or the higher layer determines it is necessary to perform the adjustment processing with respect to the variable matching circuit 200, and notifies the controller 500 about the result of determination.

Upon receiving an instruction to start the adjustment processing with respect to the variable matching circuit 200, the controller 500 initializes various variables (Step S101). As the initialization of the variables, the adjusting unit 510 of the controller 500 sets the capacitance value C1 of the first variable element 210 and the capacitance value C2 of the second variable element 220 to predetermined values. Herein, the predetermined values may be previous capacitance values, or may be values notified by, for example, the wireless unit 20.

Moreover, the adjusting unit 510 stores the state of the variable matching circuit 200 at Step S101 as a reference state. Herein, the state of the variable matching circuit 200 represents the combination of the capacitance value C1 of the first variable element 210 and the capacitance value C2 of the second variable element 220. Furthermore, the adjusting unit 510 decides on the target variable element for adjustment, the adjustment direction, and an adjustment amount C. Herein, it is assumed that the first variable element 210 is the target variable element for adjustment and that the capacitance value is increased by N1 (adjustment direction: positive direction, adjustment amount C=N1).

Then, the detecting unit 520 of the controller 500 determines whether or not the detected value of the power detector 400 has fluctuated (Step S102). As illustrated in FIG. 3, the power detector 400 detects, in a period T1, the power of the signals received by the probe 300; and outputs the detection result to the controller 500.

Herein, the electrical power detected by the power detector 400 represents the power of the signals transmitted by the antenna 100. Hence, that electrical power has a different value from the power of the signals subjected to transmit power control as illustrated in FIG. 3. The period T1 in which the power detector 400 detects the power of the signals is shorter than the period T2 in which transmit power control is performed by the wireless unit (T1<T2).

The detecting unit 520 compares the detected value with the detected value detected at the previous timing by the power detector 400. For example, the detecting unit 520 detects a detected value P1 at a timing t1 illustrated in FIG. 3 with a detected value P2 at a timing t2. In that case, since there is no fluctuation in the transmitting power of the signals, the detected values P1 and P2 are same. Thus, the detecting unit 520 determines that there is no fluctuation in the transmitting power (No at Step S102), and the processing returns to Step S102 illustrated in FIG. 2. Also when the difference between the detected values P1 and P2 is equal to or smaller than a predetermined value, it may be determined that there is no fluctuation in the transmitting power.

In the example illustrated in FIG. 3, at a timing tp1, the transmitting power fluctuates from Pa to Pb. Hence, if the detecting unit 520 compares a detected value P5 at a timing t5 with a detected value P6 at a timing t6, then it is P5<P6. Thus, the detecting unit 520 determines that the transmitting power has fluctuated (Yes at Step S102), and notifies the correcting unit 530 about the same.

Upon receiving a notification from the detecting unit 520 about the fluctuation in the transmitting power, the correcting unit 530 initializes a reference value P0 based on the detected value (Step S103). The correcting unit 530 sets the reference value P0 to the detected value that is detected at the next timing after the determination of fluctuation in the transmitting power. In the example illustrated in FIG. 3, the correcting unit 530 sets the reference value P0 to a detected value P7 at a timing t7. Then, the correcting unit 530 notifies the adjusting unit 510 about the reference value P0. Herein, although the reference value P0 is initialized by the correcting unit 530, the initialization may alternatively be performed by, for example, the adjusting unit 510.

Returning to the explanation with reference to FIG. 2, upon receiving the reference value P0 from the correcting unit 530, the adjusting unit 510 adjusts the setting value of the variable matching circuit 200 (Step S104). Herein, the adjusting unit 510 controls the first variable element 210 in such a way that the capacitance value C1 of the first variable element 210 is incremented by N. Herein, the state of the variable matching circuit 200 after the control is referred to as a state 1.

Subsequently, tine adjusting unit 510 samples the detected value P at the next timing after the change in the setting value or the variable matching circuit 200 (Step S105). After the adjusting unit 510 adjusts the variable matching circuit 200, it takes a predetermined period of time T3 until the setting value of the variable matching circuit 200 becomes the desired value. In the example illustrated in FIG. 3, it is assumed that the adjusting unit 510 adjusts the variable matching circuit 200 at a timing tc1, and that the setting value of the variable matching circuit 200 becomes the desired value at a timing tc2. In that case, the adjusting unit 510 obtains, from the power detector 400, a detected value P10 at a timing t10.

Then, the adjusting unit 510 compares the detected value P with the reference value P0 (Step S106). As a result of the comparison, if the detected value P is equal to or smaller than the reference value P0 (Yes at Step S106), then the adjusting unit 510 determines that, in the current state (the first state) thereof, the variable matching circuit 200 has converged to the reference state (Step S107).

However, if the detected value P is greater than the reference value P0 (No at Step S106), then the adjusting unit 510 determines that, in the current state (the first state) thereof, the variable matching circuit 200 has not converged to the reference state; and changes the first state, which is the current state, to the reference state (Step S108).

Then, the adjusting unit 510 determines whether the fluctuation range of the detected value P is smaller than the previous fluctuation range (Step S109). More particularly, the adjusting unit 510 stores the difference (P0−P) between the previous reference value P0 and the detected value P, and compares that difference with the difference (P0−P) between the current reference value P0 and the detected value P. As a result of the comparison, if it is determined that the current difference is equal to or greater than the previous difference, that is, if it is determined that the fluctuation range is equal to or greater than the previous fluctuation range (No at Step S109), then the adjusting unit 510 does not change the adjustment amount C and the processing proceeds to Step S112 with C=N1 holding true.

However, if it is determined that the current difference is smaller than the previous difference, that is, if it is determined that the fluctuation range is smaller than the previous fluctuation range (Yes at Step S109), then the adjusting unit 510 sets the adjustment amount C to N2 that is smaller than the pre-adjustment adjustment amount C=N1 (i.e., N1≤N2, holds true) (Step S110). Herein, since the explanation is given for an example in which the variable matching circuit 200 is adjusted for the first time after the start of the adjustment processing, the calculation result of the "previous difference" is not available. Hence, it is assumed that the adjustment amount C is not changed and the processing proceeds to Step S112 with C=N1 holding true.

Given below is the explanation of the case in which the adjusting unit 510 determines at Step S107 that, in the current state (the first state) thereof, the variable matching circuit 200 has converged to the reference state. In that case, the adjusting unit 510 determines whether the variable matching circuit 200 has converged to the reference state in all directions (Step S111). Herein, all directions mean the positive directions in which the capacitance value C1 of the first variable element 210 and the capacitance value C2 of the second variable element 220 increase, and the negative directions in which the capacitance value C1 of the first, variable element 210 and the capacitance value C2 of the second variable element 220 decrease.

Thus, in the case in which the detected value P is smaller than the reference value P0 even when the capacitance value C1 of the first variable element 210 or the capacitance value C2 of the second variable element 220 is adjusted in the positive direction and the negative direction, the adjusting unit 510 determines that the variable matching circuit 200 has converged to the reference state. More particularly, the adjusting unit 510 stores the directions of convergence determined at Step S107 and, if it is determined that convergence to a particular reference state is in all directions, determines that the variable matching circuit 200 has converged to that particular reference state in all directions (Yes at Step S111). In that case, the controller 500 performs a termination processing (described later) (Step S116).

On the other hand, if a direction is determined to be present in which convergence to a reference state has not occurred, the adjusting unit 510 determines that the variable matching circuit 200 has not converged to that particular reference state in all directions (No at Step S111). In that case, the processing proceeds to Step S112, and the adjusting unit 510 determines the next state of the variable matching circuit 200.

The following explanation is given about the processing performed at Step S112. Firstly, the explanation is given about the case in which it is determined at Step S106 that the detected value P is equal to or smaller than the reference value P0, that is, the case in which it is determined that, in the current state (the first state) thereof, the variable matching circuit 200 has converged to the reference state.

In that case, the adjusting unit 510 decides to maintain the value of the variable element adjusted at Step S104 and to adjust the capacitance value of one of the other variable elements. Herein, the adjusting unit 510 decides to maintain the capacitance value C1 of the first variable element 210 and to adjust the capacitance value C2 of the second variable element 220. More particularly, the adjusting unit 510 considers the second variable element 220 as the target variable element for adjustment, and decides to increase the capacitance value C2 of the second variable element 220 by N1 (adjustment direction: positive direction, adjustment amount C=N1).

Secondly, the explanation is given about the following case in which it is determined at Step S106 that the detected value P is greater than the reference value P0, that is, the case in which it is determined that, in the current state (the first state) thereof, the variable matching circuit 200 has not converged to the reference state.

In this case, the adjusting unit 510 decides to reset the value of the variable element adjusted at Step S104 to the pre-adjustment state, and to adjust the capacitance value of one of the other variable elements. Herein, the adjusting unit 510 decides to reset the capacitance value C1 of the first variable element 210 to the pre-adjustment state, and to adjust the capacitance value C2 of the second variable element 220.

More particularly, the adjusting unit 510 considers the first variable element 210 and the second variable element 220 as the target variable elements for adjustment. The adjusting unit 510 decides to decrease the capacitance value C1 of the first variable element 210 by N1 (adjustment direction: negative direction, adjustment amount C=N1) and decides to increase the capacitance value C2 of the second variable element 220 by N1 (adjustment direction: positive direction, adjustment amount C=N1).

Then, the detecting unit 520 determines whether or not the detected value of the power detector 400 has fluctuated (Step S113). Since the processing performed at Step S113 is identical to the processing performed at Step S102, the explanation is nor repeated. In the example illustrated in FIG. 3, the detecting unit 520 compares a detected value P11 at a timing t11 with a detected value P12 at a timing t12, and accordingly determines that the transmitting power has fluctuated (Yes at Step S113). Then, the detecting unit 520 notifies the correcting unit 530 about the determination result, and the processing proceeds to Step S114 illustrated in FIG. 2.

Upon receiving the determination result from the detecting unit 520, the correcting unit 530 samples the detected value P (Step S114). In the example illustrated in FIG. 3, the correcting unit 530 obtains, from the power detected 400, a detected value P13 at a timing t13 that is the next timing after the detecting unit 520 determines fluctuation in the transmitting power.

Returning to the explanation with reference to FIG. 2, the correcting unit 530 corrects the reference value P0 based on the fluctuation in the transmitting power detected by the detecting unit 520 (Step S115). Herein, the correcting unit 530 corrects the reference value P0 by adding, to the reference value P0, the difference between the detected value P before the fluctuation in the transmitting power and the detected value P after the fluctuation in the transmitting power. In the example illustrated in FIG. 3, the difference (P13–P11) between the detected value P11 at the timing t11 and the detected value P13 at the timing t13 is added to the reference value P0, and the addition result is set as the new reference value P0. Alternatively, the detected value P13 at the timing t13 may also be set as the new reference value P0.

The correcting unit 530 notifies the adjusting unit 510 about the corrected reference value P0. When the adjusting unit 510 receives the reference value P0 from the correcting unit 530, the processing returns to Step S104 illustrated in FIG. 2 and the adjusting unit 510 adjusts the variable matching circuit 200.

In this way, based on the result of comparison between the reference value P0 and the detected value P of the power detector 400, the controller 500 adjusts the setting value of the variable matching circuit 200 in such a way that there is an increase in the power of the signals transmitted by the antenna 100. Moreover, the controller 500 corrects the reference value P0 based on the fluctuation in the transmitting power. As a result, even when the antenna device 10 is transmitting signals while performing transmit power control, it is possible to achieve matching of the antenna 100.

In the adjustment processing illustrated in FIG. 2, once the adjusting unit 510 adjusts the variable matching circuit 200 (Step S104); after there is fluctuation in the transmitting power (Step S113), the adjusting unit 510 corrects the reference value P0 (Step S115) and adjusts the variable matching circuit 200 (Step S104). The following explanation is given about that point.

As described above, at Step S104 illustrated in FIG. 2, even if the adjusting unit 510 adjusts the variable matching circuit 200, it takes the predetermined period of time T3 until the setting value of the variable matching circuit 200 becomes the desired value. It is assumed that the variable matching circuit 200 is adjusted at a timing tc3 based on the reference value P0 and the detected value P10 sampled at the next timing of the timing tc2. In that case, after the variable matching circuit 200 is adjusted at the timing tc3, the transmitting power fluctuates before the setting value of the variable matching circuit 200 actually becomes the desired value at a timing tc4.

In this way, in case where the transmitting power fluctuates before the setting value of the variable matching circuit 200 becomes the desired value; even if the detected value P13 sampled at the next timing is different, it is not possible to distinguish whether the detected value P13 changed due to the fluctuation in the transmitting power or because of the adjustment of the variable matching circuit 200.

Hence, in the adjustment processing illustrated in FIG. 2, after adjusting the variable matching circuit 200, the adjusting unit 510 again adjusts the variable matching circuit 200 after the transmitting power fluctuates. As a result, while the variable matching circuit 200 is the adjusted, transmit power control is not performed. Thus, the antenna 100 can be match based on the result of adjusting the variable matching circuit 200.

Moreover, the reference value P0 is corrected after it is determined at Step S113 illustrated in FIG. 2 that the transmitting power has fluctuated. The reason is that the detected value in the reference state, that is, the reference value P0 also fluctuates accompanying the fluctuation in the transmitting power. In this way, when the transmitting power fluctuates, if the reference value P0 is corrected according to the fluctuation, then the antenna 100 can be match when the wireless device 1 is performing transmit power control.

Moreover, in the adjustment processing illustrated in FIG. 2, initialization or correction of the reference value P0 is performed based on the value detected at the next timing after the determination of the fluctuation in the transmitting power (see Steps, S102, S103, S113, and S114). The reason is that, as illustrated in FIG. 3, the electrical power measured for a predetermined period by the power detector 400 is output as the detected value P0 to the controller 500.

During the predetermined period when the power detector 400 is detecting the electrical power, there are times when the transmitting power fluctuates (see the timing t6 in FIG. 3). In that case, the detected value P6 is different not only from the detected value P5 at the timing t5 before the fluctuation in the transmitting power but also from the detected value P7 at the timing t7 after the fluctuation in the transmitting power. In this way, if the power detector 400 detects the electrical power at the timing of fluctuation in the transmitting power, it leads to an error in the detection result.

The detecting unit 520 compares the detected values P5 and P6, and determines that the transmitting power has fluctuated. At that time, if the reference value P0 is decided based on the detected value P6 that leads to the determination of fluctuation in the transmitting power, then the reference value P0 happens to include an error. In that regard, in the embodiment, initialization or correction of the reference value P0 is performed based on the detected value that is detected at the timing after the determination of fluctuation in the transmitting power. As a result, it becomes possible to reduce the error included in the reference value P0.

In the embodiment, after adjusting the variable matching circuit 200 once, the adjusting unit 510 waits until there is fluctuation in the transmitting power and then adjusts the variable matching circuit 200. That is done because, as described above, if the variable matching circuit 200 is adjusted without waiting for fluctuation in the transmitting power, then the transmitting power fluctuates before the variable matching circuit 200 becomes the desired setting value.

Thus, if the period of time T3 taken by the setting value of the variable matching circuit 200 to become the desired value is short or if the period T2 used for transmit power control is long and there is no fluctuation in the transmitting power while the adjusting unit 510 adjusts the variable matching circuit 200 for N number of times (where N>1), then the adjusting unit 510 may perform the adjustment for N number of times before waiting for fluctuation in the transmitting power.

In this way, it is preferred that there is no fluctuation in the transmitting power before the variable matching circuit 200 becomes the desired setting value. Thus, for example, if there is fluctuation in the transmitting power when the variable matching circuit 200 is adjusted for the N+1-th time; then, in order to achieve matching of the antenna 100, the adjusting unit 510 can adjust the variable matching circuit 200 for N number of times and then wait for fluctuation in the transmitting power before again adjusting the variable matching circuit 200. If there is a possibility of fluctuation in the transmitting power during the adjustment of the variable matching circuit 200; then adjusting the variable matching circuit 200 after waiting for the fluctuation in the transmitting power enables the wireless device 1 to match the antenna 100 while performing transmit power control.

Termination Processing

Figure 4:
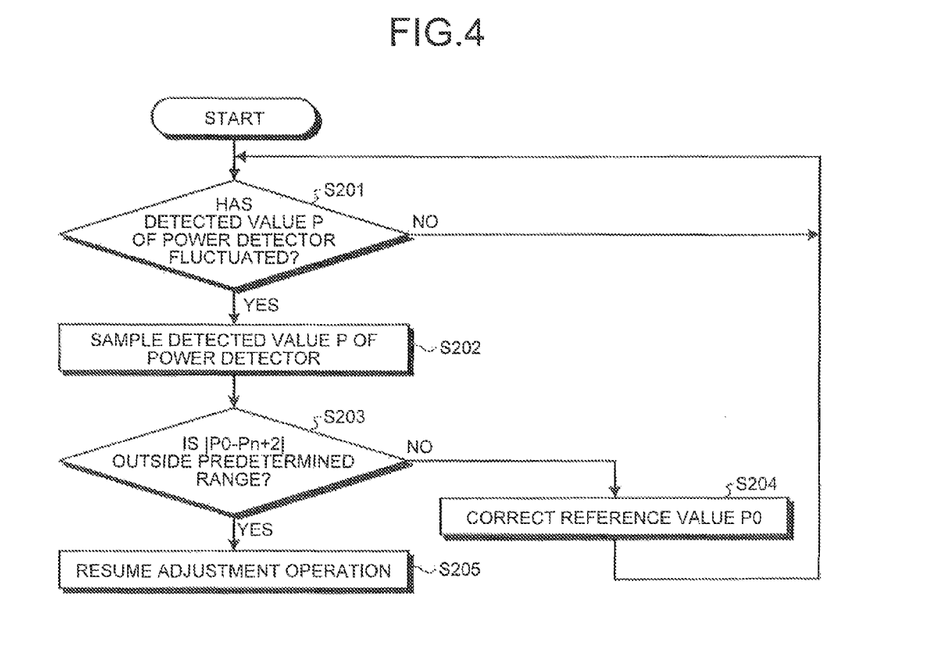
FIG. 4 is a flowchart for explaining a termination processing according to the embodiment.

Explained below with reference to FIG. 4 is the termination processing performed by the controller 500. When it is determined that the variable matching circuit 200 has converged to the concerned reference state in all directions (Yes at Step S111 in FIG. 2), the controller 500 performs the termination processing (Step S116 in FIG. 2).

As illustrated in FIG. 4, the detecting unit 520 of the controller 500 determines whether or not the detected value P of the power detector 400 has fluctuated (Step S201). More particularly, the detecting unit 520 compares a detected value Pn at a timing tn and a detected value Pn+1 at a timing tn+1 (where n is a natural number) As a result of the comparison, if it is Pn=Pn+1, then the defecting unit 520 detects that the detected value P has not fluctuated (No at Step S201). Then, the processing returns to Step S201. Also when the difference between the detected values Pn and Pn+1 is equal to or smaller than a predetermined value, the detecting unit 520 may determine that there is no fluctuation in the transmitting power.

If it is Pn≠pN+1, then the detecting unit 520 determines that the detected value P has fluctuated. (Yes at Step S201) and, at the next timing (at a timing tn+2), samples a detected value Pn+2 detected by the power detector 400 (Step S202).

The detecting unit 520 calculates a difference Pd=|P0−Pn+2| between the detected value Pn+2 and the reference value P0, and determines whether or not the difference Pd is outside of a predetermined range (Step S203). Generally, the wireless unit 20 performs transmit power control by increasing or reducing the transmitting power of the signals by a predetermined value PA. Thus, if the calculated difference Pd is determined to be within a predetermined range (PA±d) including the predetermined value PA (No at Step S203), then the detecting unit 520 determines that transmit power control has been performed and notifies the correcting unit 530 about the result of determination.

During the termination processing, when a notification that transmit power control has been performed is received from the detecting unit 520, the correcting unit 530 corrects the reference value P0 based on the fluctuation in the transmitting power (Step S204). Herein, the correcting unit 530 corrects the reference value P0 in the same manner as that at Step S115 illustrated in FIG. 2. Then, the correcting unit 530 notifies the adjusting unit 510 and the detecting unit 520 about the corrected reference value P0.

If the calculated difference Pd is determined to be outside the predetermined range including the predetermined value PA (Yes at Step S203), then the detecting unit 520 determines that the antenna 100 is mismatched and notifies the adjusting unit 510 about result of determination. Upon receiving the notification from the detecting unit 520, the adjusting unit 510 resumes controlling the variable matching circuit (Step S205) and performs the adjustment processing illustrated in FIG. 2.

In the embodiment, when the adjustment processing illustrated in FIG. 2 is terminated, the termination processing illustrated in FIG. 4 is performed. As a result, it is not only that the reference value P0 can be corrected according to the fluctuation in the transmitting powers but also that the adjustment processing can be resumed in case the antenna 100 is not matched due to fluctuation in the surrounding environment of the wireless device 1. Therefore, even if the antenna 100 is not matched due to fluctuation in the surrounding environment of the wireless device 1, it becomes possible to perform automatic matching of the antenna 100.

As described above, in the wireless device 1 according to the embodiment, as a result of using the antenna device 10, even when wireless communication based on transmit power control is being performed, automatic matching of the antenna 100 can be performed while performing wireless communication,

MODIFICATION EXAMPLE

Figure 5:
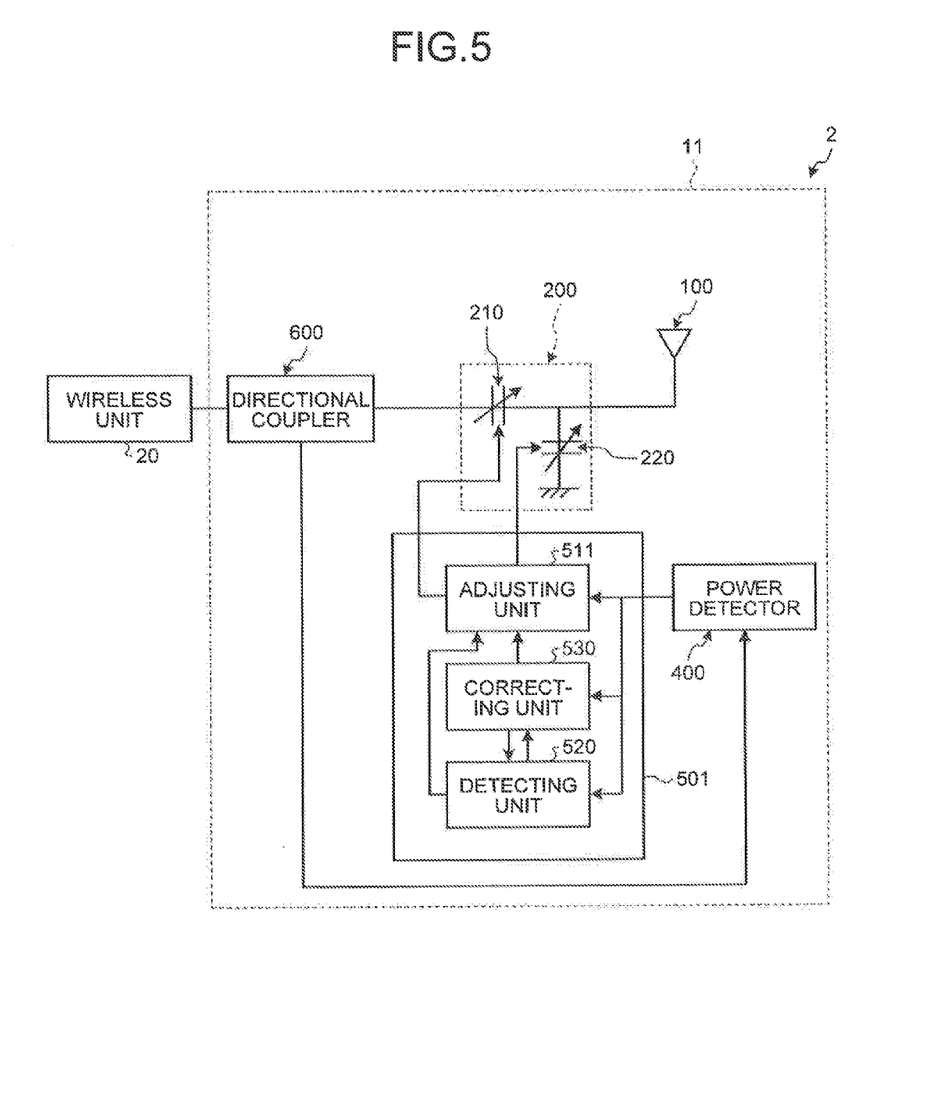
FIG. 5 is a diagram illustrating a configuration of a wireless device according to a modification example of the embodiment.

Explained below with reference to FIG. 5 is a modification example of the wireless device 1 according to the embodiment. FIG. 5 is a diagram illustrating a configuration of a wireless device 2 according to the modification example. The wireless device 2 includes a directional coupler 600 in place of the probe 300. Aside from that and except for an adjusting unit 511 of a controller 501, the wireless device 2 has an identical configuration to the wireless device 1 illustrated in FIG. 1. The constituent elements identical to the wireless device 1 illustrated in FIG. 1 are referred to by the same reference numerals, and the relevant explanation is not repeated.

The directional coupler 600 illustrated in FIG. 5 has one end connected to the wireless unit 20 and has the other end connected to the variable matching circuit 200. The directional coupler 600 retrieves reflected waves that, from among the signals output by the wireless unit 20, reflect toward the wireless unit 20 from the antenna 100 without being transmitted by the antenna 100. Then, the directional coupler 600 outputs the reflected waves to the power detector 400.

The power detector 400 detects the power of the reflected waves received by the directional coupler 600, and outputs the detection result to the controller 501. Based on the detected value F output by the power detector 400, the controller 501 matches the antenna 100 by adjusting the setting value of the variable matching circuit 200 in such a way that there is an increase in the power of the signals transmitted by the antenna 100.

The directional coupler 600 takes out the reflected waves from the antenna 100. In addition, to the antenna 100 not being matched, smaller the power of the signals transmitted by the antenna 100; greater are the reflected waves retrieved by the directional coupler 600. Hence, the adjusting unit 511 of the controller 501 adjusts the variable matching circuit 200 in such a way that the reflected waves become smaller.

At Step S106 of the adjustment processing illustrated in FIG. 2, when the detected value P is equal to or greater than the reference value P0, it is determined that, in the current state (the first state) thereof, the variable matching circuit 200 has converged to the reference state. On the other hand, when the detected value P is smaller than the reference value P0, it is determined that, in the current state (the first state) thereof, the variable matching circuit 200 has not converged to the reference state. The variable matching circuit 200 is adjusted in such a way that the reflected waves become smaller by changing the process of step S106 to "P≥P0?". Other steps than step S106 are the same as those in FIG. 2. Hence, the relevant explanation is not repeated.

As described above, according to the modification example, as a result of using the directional coupler 600 in place of the probe 300, even when the wireless device 2 is performing wireless communication while performing transmit power control, an antenna device 11 can perform automatic matching of the antenna 100 while performing wireless communication.

While certain embodiments have been described, these embodiments nave been presented by way of example only, and are not intended to limit the scope of the inventions. Indeed, the novel embodiment described herein may be embodied in a variety of other forms; furthermore, various omissions, substitutions and changes in the form of the embodiment described herein may be made without departing from the spirit of the inventions. The accompanying claims and their equivalents are intended to cover such forms or modifications as would fall within the scope and spirit of the inventions.

What is claimed is:

1. A control device comprising:
   a power detector that detects, at a first period, a power of a signal transmitted by an antenna, a transmitting power of the signal fluctuating at a second period longer than the first period due to transmit power control;
   an adjuster that adjusts a setting value of a variable matching circuit in such a way that the power increases based on a result of comparison of a reference value with a detected power of the power detector;
   a detector that detects whether or not the transmitting power is fluctuated based on a temporal change in the power detected by the power detector; and
   a corrector that corrects the reference value when the detector detects that the transmitting power is fluctuated.

2. The control device according to claim 1, wherein:
   the antenna transmits the signal which fluctuates in the transmitting power due to transmit power control, and
   the variable matching circuit matches impedance of the antenna.

3. The control device according to claim 1, wherein:
   the adjuster adjusts the setting value of the variable matching circuit after the detector detects the fluctuation in the transmitting power; and
   the adjuster decides the setting value of the variable matching circuit based on a result of comparison between the detected value after adjustment and the reference value after correction.

4. The control device according to claim 3, wherein, when the difference between the reference value and the detected value after adjusting the variable matching circuit is smaller than the difference between the reference value and the detected power before adjusting the variable matching circuit, the adjuster reduces an amount of adjustment of the setting value of the variable matching circuit to be smaller than the amount of adjustment before adjustment.

5. The control device according to claim 1, wherein:
   the corrector corrects the reference value to the detected power that is detected at the next timing after fluctuation in the transmitting power.

6. The control device according to claim 1, wherein:
   the corrector adds, to the reference value, the difference between a detected power before the fluctuation in the transmitting power and the detected power after the fluctuation in the transmitting power, to correct the reference value.

7. The control device according to claim 1, wherein:
   the variable matching circuit includes a first variable element and a second variable element, and
   when the power decreases after adjusting a setting value of the first variable element, the adjuster adjusts the setting value of the first variable element to a pre-adjustment state and adjusts a setting value of the second variable element.

8. The control device according to claim 1, further comprising a probe that receives the signal transmitted by the antenna, wherein:
   the power detector detects, as the power of the signal, a power of a signal received by the probe, and
   the adjuster decides on the setting value in such a way that the detected power increases.

9. The control device according to claim 1, further comprising a directional coupler that takes out a reflected wave reflected from the antenna, wherein:
   the power detector detects, as the power of the signals, a power of the reflected wave, and
   the adjuster decides on the setting value in such a way that the detected power decreases.

10. The control device according to claim 1, further comprising a wireless unit that generates the signal and performs transmit power control with respect to the signal.

11. An automatic matching method for antennas comprising:
    transmitting, by an antenna, a signal which fluctuates in a transmitting power at a second period longer than a first period due to transmit power control;
    detecting, by a power detector, at the first period, a power of the signal transmitted by the antenna;
    matching, by a variable matching circuit, impedance of the antenna;
    adjusting a setting value of the variable matching circuit in such a way that the power increases based on a result of comparison of a reference value with a detected power of the power detector;
    detecting whether or not the transmitting power is fluctuated based on a temporal change in the power detected by the power detector; and
    correcting the reference value when the detector detects that the transmitting power is fluctuated.

12. A wireless device comprising:
    a wireless unit that generates a signal and performs transmitting power control with respect to the signal;
    a power detector that detects, at a first period, a power of the signal transmitted by an antenna, a transmitting power of the signal fluctuating at a second period longer due to the transmitting power due to the transmitting power control; and
    an adjuster that adjusts a setting value of a variable matching circuit in such a way that the power increases based on a result of comparison of a reference value with a detected power of the power detector;

a detector that detects whether or not the transmitting power is fluctuated based on a temporal change in the power detected by the power detector; and a corrector that corrects the reference value when the detector detects that the transmitting power is fluctuated.

* * * * *